(12) United States Patent
Behres et al.

(10) Patent No.: US 7,317,202 B2
(45) Date of Patent: Jan. 8, 2008

(54) METHOD FOR MANUFACTURE OF AN EPITAXIAL STRUCTURAL ELEMENT LAYER SEQUENCE AND OPTOELECTRONIC SEMICONDUCTOR CHIP

(75) Inventors: Alexander Behres, Kelheim (DE); Norbert Linder, Wenzenbach (DE); Bernd Mayer, Regensburg (DE)

(73) Assignee: Osram Opto Semiconductors, GmbH, Regensburg (DE)

( * ) Notice: Subject to any disclaimer, the term of this patent is extended or adjusted under 35 U.S.C. 154(b) by 0 days.

(21) Appl. No.: 10/952,154

(22) Filed: Sep. 28, 2004

(65) Prior Publication Data

US 2005/0116242 A1 Jun. 2, 2005

(30) Foreign Application Priority Data

Sep. 30, 2003 (DE) ................ 103 45 413
Dec. 30, 2003 (DE) ................ 103 61 659

(51) Int. Cl.
*H01L 31/00* (2006.01)
*H01L 33/00* (2006.01)

(52) U.S. Cl. .................... 257/12; 257/9; 257/14; 257/E29.068; 438/22; 438/46; 438/48; 438/57; 438/93

(58) Field of Classification Search ............. None
See application file for complete search history.

(56) References Cited

U.S. PATENT DOCUMENTS 4,148,045 A    4/1979   Fang et al.
5,048,036 A *  9/1991   Scifres et al. .......... 372/45.011
5,194,922 A *  3/1993   Moser
5,442,203 A *  8/1995   Adomi et al.
5,753,933 A *  5/1998   Morimoto
6,542,528 B1   4/2003   Sato et al.
6,628,694 B2   9/2003   Deng et al.

FOREIGN PATENT DOCUMENTS

DE   28 38 818 A1    3/1979
DE   40 11 145 A1   10/1991
DE   102 17 304 A1  10/2002
WO   WO 00/38287     6/2000

* cited by examiner

*Primary Examiner*—Leonardo Andujar
*Assistant Examiner*—Kevin Quinto
(74) *Attorney, Agent, or Firm*—Cohen Pontani Lieberman & Pavane LLP

(57) ABSTRACT

A technique for fabricating an epitaxial component layer sequence based on a first III/V compound semiconductor material system with a first group V element on a substrate or a buffer layer, which comprises a material based on a second III/V compound semiconductor material system with a second group V element, which is different from the first group V element. At least one layer sequence with a first and a second III/V compound semiconductor material layer is applied to the substrate or to the buffer layer before the application of the epitaxial component layer sequence, the first and second III/V compound semiconductor material layers having different compositions from one another and containing both the first and the second group V elements.

11 Claims, 1 Drawing Sheet

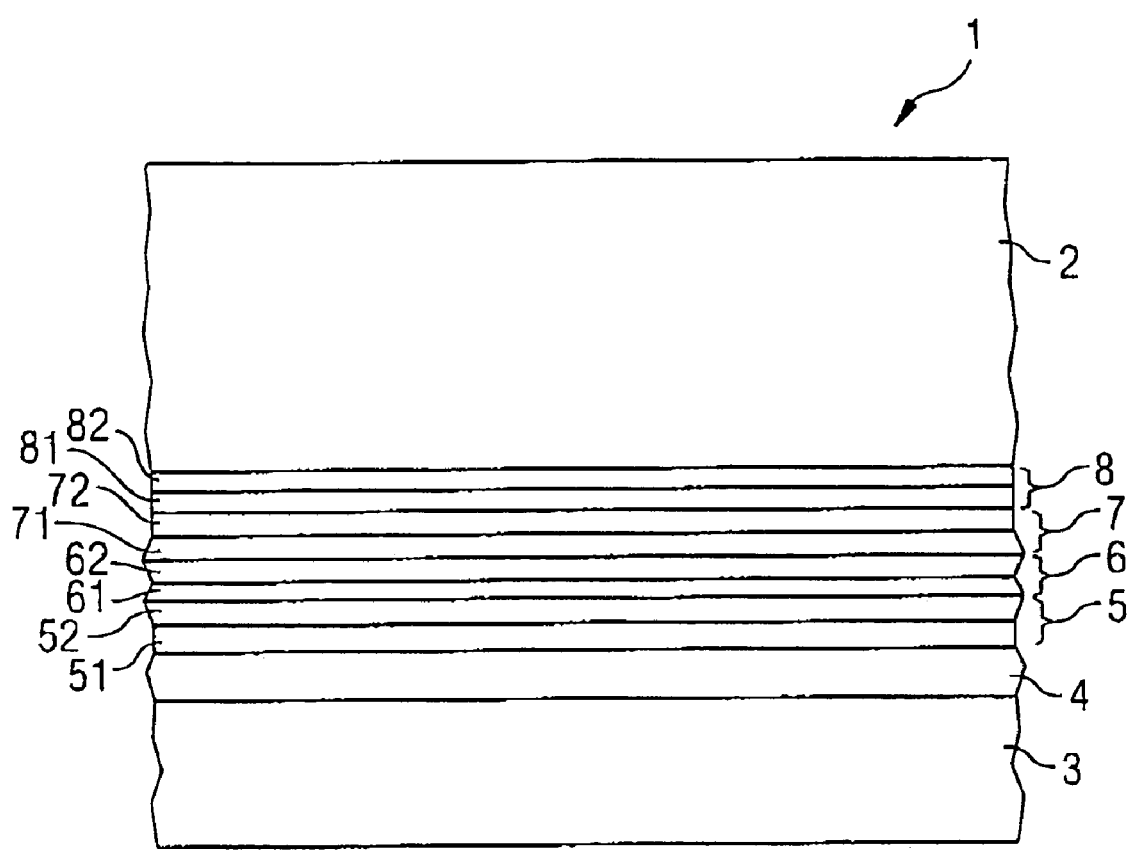

METHOD FOR MANUFACTURE OF AN EPITAXIAL STRUCTURAL ELEMENT LAYER SEQUENCE AND OPTOELECTRONIC SEMICONDUCTOR CHIP

REFERENCE TO RELATED APPLICATIONS

The present application claims the priority of German Patent Application Nos. 10 345 413.6 filed 30 Sep. 2003 and 10 361 659.4 filed 30 Dec. 2003, the disclosure contents of which are hereby incorporated by reference.

FIELD OF THE INVENTION

The invention relates to a method for fabricating an epitaxial component layer sequence based on a first III/V compound semiconductor material system with a first group V element on a substrate or a buffer layer, which comprises a material based on a second III/V compound semiconductor material system with a second group V element, which is different from the first group V element. It furthermore relates to a corresponding optoelectronic semiconductor chip.

BACKGROUND OF THE INVENTION

Optoelectronic semiconductor chips can include a component layer sequence, including active (photon generating) layers, grown epitaxially on a substrate. The substrate onto which the active (photon generating) layers are grown epitaxially has an important influence on the quality of the active layers. If the substrate exhibits defects, defects are likely to be formed in the active layers epitaxially grown on this substrate as well. Furthermore, if the lattice constant of the substrate is different from the lattice constant of the epitaxially grown layers, strain can be induced in the active layers. Consequently the quality of the substrate influences the active layers.

Particularly in the case of optoelectronic semiconductor chips based on compound semiconductor materials that are grown epitaxially on substrates which do not originate from the same material system (where this term refers to a plurality of materials based on the same group-V element, e.g. As, N, P) as that of the component layer sequence, there is a need to reduce the influence of the substrate quality on the active layers of the component layer sequence. This is of importance in particular for semiconductor laser diode chips, and especially for those with an InGaAlP-based laser diode structure, which is frequently grown on GaAs substrates. However, a similar situation also applies, for example, to other optoelectronic semiconductor chips based on InGaAlP.

The group of optoelectronic, viz. radiation-emitting and/or radiation-detecting, semiconductor chips based on InGaAlP includes in particular those chips in which the epitaxially fabricated radiation-generating semiconductor component layer sequence, which generally has a layer sequence made of various individual layers, contains at least one individual layer which has a material from the III-V compound semiconductor material system $In_xAl_yGa_{1-x-y}P$ where $0 \leq x \leq 1$, $0 \leq y \leq 1$ and $x+y \leq 1$. The semiconductor component layer sequence may have, for example, a conventional pn junction, a double heterostructure, a single quantum well structure (SQW structure) or a multiple quantum well structure (MQW structure). Such structures are known to the person skilled in the art and, therefore, are not explained in any further detail herein.

SUMMARY OF THE INVENTION

One object of the present invention is to provide a method of the type mentioned in the introduction which makes it possible to reduce the influence of the substrate quality in particular on the optical and electrical qualities of the component layer sequence and also the aging stability.

Another object of the present invention is to provide a corresponding optoelectronic semiconductor chip.

These and other objects are attained in accordance with one aspect of the present invention directed to a method for fabricating an epitaxial component layer sequence based on a first III/V compound semiconductor material system with a first group V element on a substrate or a buffer layer, which comprises a material based on a second III/V compound semiconductor material system with a second group V element, which is different from the first group V element. At least one layer sequence with a first and a second III/V compound semiconductor material layer is applied to the substrate or to the buffer layer before the application of the epitaxial component layer sequence, the first and second III/V compound semiconductor material layers having different compositions from one another and containing both the first and the second group V elements.

This method preferably produces a ramplike transition from growth that is stabilized with the second group V element (i.e an epitaxially grown layer having characteristic properties that are determined by the second group V element) to growth that is stabilized with the first group V element (i.e an epitaxially grown layer having characteristic properties that are determined by the first group V element).

In this context, "ramplike transition" means that the concentration of the second group V element within the first and second layers decreases continually as seen from the substrate in the direction of the active layers, and the concentration of the first group V element increases continually. The term "continually" means that the polarity of change does not reverse, although it could be zero. Thus, the concentration changes of the first and second group V elements can proceed steadily (i.e. the change is always >0) or stepwise (i.e. the change is >or =to 0). Furthermore, the concentration of the first group V element need not necessarily increase from the substrate in the direction of the component layer sequence to the same extent as the concentration of the second group V element decreases in this direction.

In one embodiment, a plurality of layer sequences with, in each case, a first and a second III/V compound semiconductor material layer are applied to the substrate or to the buffer layer before the application of the epitaxial component layer sequence. The content of the second group V element in the plurality of layer sequences decreases on average (i.e. the polarity of change can include a temporary reversal) in the direction from the substrate or from the buffer layer toward the active layers.

In one embodiment, the first III/V compound semiconductor material layer(s) has(have) a quinternary composition (the latter may also be different in the case of a plurality of first III/V compound semiconductor material layers) and the second III/V compound semiconductor material layer(s) has(have) a quinternary, quaternary, or ternary composition (the latter may also be different in the case of a plurality of first III/V compound semiconductor material layers).

The method can be suitable for fabricating semiconductor chips in which the substrate is a GaAs substrate or a GaAs-based substrate, the component layer sequence is an $In_xGa_yAl_{1-x-y}P$-based III/V compound semiconductor layer sequence where $0 \leq x \leq 1$, $0 \leq y \leq 1$ and $x+y \leq 1$ and the first and second III/V compound semiconductor material layer(s) are $In_xGa_yAl_{1-x-y}As_zP_{1-z}$ layers where $0 \leq x \leq 1$, $0 \leq y \leq 1$; $x+y \leq 1$ and $0 \leq z \leq 1$.

A plurality of layer sequences can be provided, each layer sequence comprising an $In_xGa_yAl_{1-x-y}As_zP_{1-z}$ layer where $0<x<1$, $0<y<1$; $x+y \leq 1$ and $0<z<1$ and a $GaAs_zP_{1-z}$ layer where $0<z<1$, or consisting of an $In_xGa_yAl_{1-x-y}As_zP_{1-z}$ layer where $0<x<1$, $0<y<1$; $x+y \leq 1$ and $0<z<1$ and a $GaAs_zP_{1-z}$ layer where $0<z<1$.

The method is furthermore suitable for fabricating semiconductor chips in which the substrate is a GaAs substrate or a GaAs-based substrate, the component layer sequence is an $In_xGa_yAl_{1-x-y}P$-based III/V compound semiconductor layer sequence where $0 \leq x \leq 1$, $0 \leq y \leq 1$ and $x+y \leq 1$ and the first III/V compound semiconductor material layer(s) are quinternary $In_xGa_yAl_{1-x-y}As_zP_{1-z}$ layers where $0<x \leq 1$, $0<y \leq 1$; $x+y \leq 1$ and $0<z<1$ and the second III/V compound semiconductor material layer(s) are quaternary $In_xGa_yAl_{1-x-y}As_zP_{1-z}$ layers where $0 \leq x \leq 1$, $0 \leq y \leq 1$; $x+y \leq 1$ and $0<z<1$.

The layer thicknesses of the first and second III/V compound semiconductor material layer(s) is preferably between 1 nm and 50 nm inclusive.

Further advantages, advantageous embodiments and developments of the method and of the semiconductor chip emerge from the embodiment explained below in conjunction with the figure.

BRIEF DESCRIPTION OF THE DRAWINGS

The FIGURE (unnumbered) shows a schematic sectional illustration of a semiconductor chip fabricated by a method according to the invention.

DETAILED DESCRIPTION OF THE DRAWINGS

The layer thicknesses illustrated in the embodiment are not to be regarded as true to scale. Rather, in order to provide a better understanding, their thickness is exaggerated and they are not illustrated with the actual relative thicknesses with respect to one another.

In optoelectronic semiconductor chips, of the type to which the present invention is applied, the substrate and the active layers both contain a III/V-semiconductor material. The III/V-semiconductor material of the substrate contains a group-V-element, which is different from the group-V-element of the active layers.

To avoid problems occurring from the differences in the material composition of the substrate and the active layers, the present invention provides an intermediate sequence of thin layers grown between the substrate and the active layer. In each of the layers of the intermediate sequence, both of the group-V-elements are present and such layers have different compositions. In one embodiment, the layer adjacent to the substrate contains an high amount of the group-V-element of the substrate and a small amount of the group-V-element of the active layers. The next layer contains a little more of the group-V-element of the active layers and a little less of the group-V-element of the substrate. Thus, an intermediate layer sequence is formed, wherein adjacent layers have nearly the same material composition and the change in group-V-elements takes place gradually from layer to layer. In this way problems, which occur if one kind of a III/V semiconductor material is grown directly on another III/V semiconductor material, can be avoided or reduced. Preferably, the change in the material composition is as small as possible between two adjacent layers. In the case that each layer is an atomic monolayer and the change in material composition is very gradual, the change can be called steady in the sense that it is>0. However, the realization of such a layer sequence is complicated and expensive in most cases. Therefore, a limited number of layers are deposited between the substrate and the active layers and the change in material composition can be stepwise, i.e >or=to 0. The smallest number of layers in the intermediate layer sequence between the substrate and the active layers which is possible in accordance with the invention is two.

The semiconductor chip illustratively depicted in the FIGURE is a laser diode chip 1 with a laser-active component layer sequence 2 based on InGaAlP, which is grown epitaxially on a GaAs substrate 3. Thus, the first group-V element (i.e the group-V element of the active layers) is P and the second group-V element (i.e the group-V element of the substrate) is As.

Firstly, an n-doped GaAs buffer layer 4 is grown epitaxially on the substrate 3, on which buffer layer there are subsequently grown four layer pairs (layer sequences) 5, 6, 7, 8 each having an n-doped InGaAlAsP layer 51, 61, 71, 81 (thickness for example 20 nm in each case) and in each case an n-doped GaAsP layer 52, 62, 72, 82 (thickness for example 4 nm in each case), to be more precise in such a way that the InGaAlAsP layers and GaAsP layers alternate with one another in the layer sequence.

Thus, each of the intermediate layers includes both As and P. Also, in accordance with the invention, these layers have different compositions from one another.

In accordance with an embodiment of the invention, the P content (illustrative of the first group-V element) may increase steadily, stepwise, or at least on average in the layer pairs in the direction from the substrate toward the component layer sequence.

In accordance with an embodiment of the invention, the As content (illustrative of the second group-V element) may decrease steadily, stepwise, or at least on average in the layer pairs in the direction from the substrate toward the component layer sequence.

It should be clear that the invention contemplates the alternative of no decrease/increase on average, as long as the intermediate layers differ in composition from each other and each has both As and P contents.

As an alternative, subsequently also four layer pairs (layer sequences) 5, 6, 7, 8 having in each case an n-doped InGaAlAsP layer 51, 61, 71, 81 and in each case an n-doped GaAlAsP layer 52, 62, 72, 82 may be grown epitaxially on the n-doped GaAs buffer layer 4.

Furthermore, the concentration of the P content (first group-V element) need not necessarily increase from the substrate in the direction of the active layer sequence to the same extent as the As content (the second group V element) decreases in this direction. Thus, if the P content increases by 2% from one layer to the next, the As content need not decrease by 2%.

A conventional multiple quantum well laser diode structure is then grown as the component layer sequence 2 on the four layer pairs 5, 6, 7, 8.

The epitaxial growth is carried out for example by means of metal organic vapor phase epitaxy (MOVPE).

In the embodiment, in addition to a targeted incorporation of impurity atoms (concomitantly migrating at the growth front), at the heterointerfaces, by virtue of the In content, dislocation defects are trapped, and the crystal and interface quality is increased by virtue of the targeted mixture of the two group V elements. The admixture of phosphorus in the layer pairs 5, 6, 7, 8 makes it possible to compensate for a lowering of the band edge caused by the In content, in order to increase the electrical conductivity of the layer pairs and to prevent absorption. Through a targeted strain of the layer pairs (superlattice), it is possible to set a desired strain of the entire device structure. The mixture of the two group V elements results in this case in a ramplike transition from As-stabilized growth (i.e. an epitaxially-grown layer having characteristics determined by As) to P-stabilized growth (i.e. an epitaxially-grown layer having characteristics determined by P).

The invention is not restricted to the embodiments described above, but rather applies to all methods and semiconductor chips which have the fundamental features of the invention. In particular, the invention can be applied, in principle, to all III/V compound semiconductor material systems but also to II/VI compound semiconductor material systems.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

We claim:

1. A method for fabricating an epitaxial component layer sequence based on a first III/V compound semiconductor material system with a first group V element on a substrate or a buffer layer, the substrate or the buffer layer comprising a material based on a second III/V compound semiconductor material system with a second group V element, which is different from the first group V element,
   wherein
   at least one layer sequence with a first and a second III/V compound semiconductor material layer is applied to the substrate or to the buffer layer before the application of the epitaxial component layer sequence, the first and second III/V compound semiconductor material layers having different compositions from one another and containing both the first and the second group V elements, and
   the first III/V compound semiconductor material layer has a quinternary composition and the second III/V compound semiconductor material layer has a ternary composition;
   wherein
   a plurality of layer sequences with in each case a first and a second III/V compound semiconductor material layer are applied to the substrate or to the buffer layer before the application of the epitaxial component layer sequence.

2. The method as claimed in claim 1, wherein
   the content of the second group V element in the plurality of layer sequences decreases on average in the direction from the substrate or from the buffer layer toward the epitaxial component layer sequence.

3. The method as claimed in claim 1, wherein
   the substrate is a GaAs substrate or a GaAs-based substrate, the component layer sequence is an $In_xGa_yAl_{1-x-y}P$-based III/V compound semiconductor layer sequence where $0 \leq x \leq 1$, $0 \leq y \leq 1$ and $x+y \leq 1$ and the first and second III/V compound semiconductor material layer(s) are $In_xGa_yAl_{1-x-y}As_zP_{1-z}$ layers where $0 \leq x \leq 1$, $0 \leq y \leq 1$; $x+y \leq 1$ and $0<z<1$.

4. The method as claimed in claim 1, wherein
   a plurality of layer sequences is provided, each layer sequence comprising an $In_xGa_yAl_{1-x-y}As_zP_{1-z}$ layer where $0<x<1$, $0<y \leq 1$; $x+y \leq 1$ and $0<z<1$ and a $GaAs_zP_{1-z}$ layer where $0<z<1$, or consisting of an $In_xGa_yAl_{1-x-y}As_zP_{1-z}$ layer where $0<x<1$, $0<y<1$; $x+y \leq 1$ and $0<z<1$ and a $GaAs_zP_{1-z}$ layer where $0<z<1$.

5. The method as claimed in claim 1, wherein
   the growth of the layer sequence(s) produces a ramplike transition from As-stabilized growth to P-stabilized growth.

6. The method as claimed in claim 1, wherein
   layer thicknesses of the first and second III/V compound semiconductor material layer(s) are between 1 nm and 50 nm inclusive.

7. An optoelectronic semiconductor chip with an epitaxial component layer sequence based on a first III/V compound semiconductor material system with a first group V element on a substrate or a buffer layer, the substrate or the buffer layer comprising a material based on a second III/V compound semiconductor material system with a second group V element, which is different from the first group V element,
   wherein
   at least one layer sequence with a first and a second III/V compound semiconductor material layer is arranged between the substrate or the buffer layer and the epitaxial component layer sequence, the first and second III/V compound semiconductor material layers having different compositions from one another and containing both the first and the second group V elements; and
   the first III/V compound semiconductor material layer has a quinternary composition and the second III/V compound semiconductor material layer has a ternary composition;
   wherein
   provision is made of a plurality of layer sequences each having a first and and a second III/V compound semiconductor material layer.

8. The optoelectronic semiconductor chip as claimed in claim 7, wherein the content of the second group V element in the plurality of layer sequences decreases on average in the direction from the substrate or from the buffer layer toward the epitaxial component layer sequence.

9. The optoelectronic semiconductor chip as claimed in claim 7, wherein the substrate is a GaAs substrate or a GaAs-based substrate, the component layer sequence is an $In_xGa_yAl_{1-x-y}P$-based III/V compound semiconductor layer sequence where $0 \leq x \leq 1$, $0 \leq y \leq 1$ and $x+y \leq 1$ and the first and second III/V compound semiconductor material layer(s) are $In_xGa_yAl_{1-x-y}As_zP_{1-z}$, layers where $0 \leq x \leq 1$, $0 \leq y \leq 1$; $x+y \leq 1$ and $0<z<1$.

10. The optoelectronic semiconductor chip as claimed in claim 7, wherein a plurality of layer sequences are provided, each layer sequence comprising an $In_xGa_yAl_{1-x-y}As_zP_{1-z}$ layer where $0<x<1$, $0<y \leq 1$; $x+y<1$ and $0<z<1$ and a $GaAs_zP_{1-z}$ layer where $0<z<1$, or consisting of an $In_xGa_yAl_{1-x-y}As_zP_{1-z}$ layer where $0<x<1$, $0<y<1$; $x+y \leq 1$ and $0<z<1$ and a $GaAs_zP_{1-z}$ layer where $0<z<1$.

11. The optoelectronic semiconductor chip as claimed in claim 7, wherein the layer thicknesses of the first and second III/V compound semiconductor material layer(s) lie between 1 nm and 50 nm inclusive.

* * * * *